(12) United States Patent
Khlat

(10) Patent No.: US 7,339,499 B2
(45) Date of Patent: Mar. 4, 2008

(54) KEYPAD SIGNAL INPUT APPARATUS

(75) Inventor: Nadim Khlat, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 248 days.

(21) Appl. No.: 10/557,431

(22) PCT Filed: Jun. 30, 2004

(86) PCT No.: PCT/EP2004/007063

§ 371 (c)(1),
(2), (4) Date: Nov. 16, 2005

(87) PCT Pub. No.: WO2006/002661

PCT Pub. Date: Jan. 12, 2006

(65) Prior Publication Data

US 2006/0284741 A1 Dec. 21, 2006

(51) Int. Cl.
H03M 11/00 (2006.01)
(52) U.S. Cl. .......................... 341/26; 341/22; 345/168; 340/14.1
(58) Field of Classification Search .................. 341/20, 341/22, 26; 345/168; 340/14.1
See application file for complete search history.

(56) References Cited

U.S. PATENT DOCUMENTS

| | | | |
|---|---|---|---|
| 4,532,497 A | 7/1985 | Danish | |
| 4,810,992 A | 3/1989 | Eventoff | |
| 5,036,320 A * | 7/1991 | Wroblewski | 341/26 |
| 5,386,584 A | 1/1995 | Verstegen et al. | |
| 5,929,790 A | 7/1999 | Lim | |
| 5,943,044 A | 8/1999 | Martinelli et al. | |
| 6,184,805 B1 * | 2/2001 | Uggmark | 341/29 |
| 6,222,466 B1 * | 4/2001 | Uggmark | 341/22 |
| 6,509,846 B1 | 1/2003 | Fujiki | |

FOREIGN PATENT DOCUMENTS

| | | |
|---|---|---|
| EP | 0435438 B1 | 3/1998 |
| EP | 0932117 A2 | 7/1999 |
| EP | 1006545 B1 | 8/2004 |

OTHER PUBLICATIONS

Rotzer et al "Use of an A-D Converter in a Microcontroller for Key Decoding" Motorola Technical Developments, Motorola, Inc.; Schaumburg, IL, USA; vol. 20, pp. 108-109; Oct. 1993; XP000403840.

* cited by examiner

Primary Examiner—Albert K. Wong

(57) ABSTRACT

Keypad apparatus for registering signals corresponding to data that a user enters by pressure on keys of an array in a surface extending in two dimensions. The elements of first and second sets of impedance elements (R) are connected in series through respective interconnections and a signal processor applies first and second reference signals across the first and second sets of impedance elements respectively. User pressure on the keys makes or breaks connections through corresponding contact elements between a respective pair of the interconnections, one from the first set of impedance elements and one from the second set of impedance elements, so as to generate first and second output signals (PX1, PY1) that together are a corresponding combination of the first and second reference signals that is unique to the actuated key elements.

11 Claims, 8 Drawing Sheets

- PRIOR ART -  FIG. 1

*- PRIOR ART -*

KEYPAD SIGNAL INPUT APPARATUS

FIELD OF THE INVENTION

This invention relates to keypad apparatus for registering signals corresponding to data that a user enters by pressure on discrete features of a surface extending in two dimensions and to data entry apparatus including such keypad apparatus.

BACKGROUND OF THE INVENTION

Keypads are used in various devices, including portable telephones and personal digital assistants ('PDAs') for example. The discrete features that the user presses to enter data may take various forms, such as push-buttons projecting through the surface or elastic relief on the surface, for example. The number of features will depend on the application that the keypad is used for but typically is of the order of 20 to 40, for example 28 if the features form a 4 by 7 array.

The keypad generates electrical signals, which are then processed by a signal processor. Typically, the signal processor has a limited number of input pins available for each input or output device to which it is connected. This is especially the case if the signal processor is integrated with an applications processor providing application programmes for the user, which is desirable, since such a configuration offers advantages such as fast reaction times in addition to reduced package size.

Another type of data entry apparatus is a touch panel or touch screen, in which a two-dimensional surface is sensitive to the position at which a user touches the surface using a pointed object such as a stylus or his finger, for example. A touch screen may simultaneously display an image produced by the device and the device reacts to the position at which the user touches the surface relative to the displayed image. The positional sensitivity of the screen or panel to the touch is essentially continuous, unlike a keypad, the discrete features of which are discontinuous. The touch screen or panel also requires input pins at a signal processor. Touch screens and panels find wide application. However keypads also find wide application both for cost reasons, if they are used instead of touch panels, and for ergonomic reasons, since they provide a simple and easy way of entering alphanumeric data.

It is desirable to limit the overall number of input pins required at the signal processor, for example to avoid increasing its package size and die size in the case of an integrated circuit processor. It is also desirable to limit the number of different signal processors.

SUMMARY OF THE INVENTION

The present invention provides keypad apparatus and data entry apparatus as described in the accompanying claims.

DETAILED DESCRIPTION OF THE PREFERRED EMBODIMENTS

Figure 1:
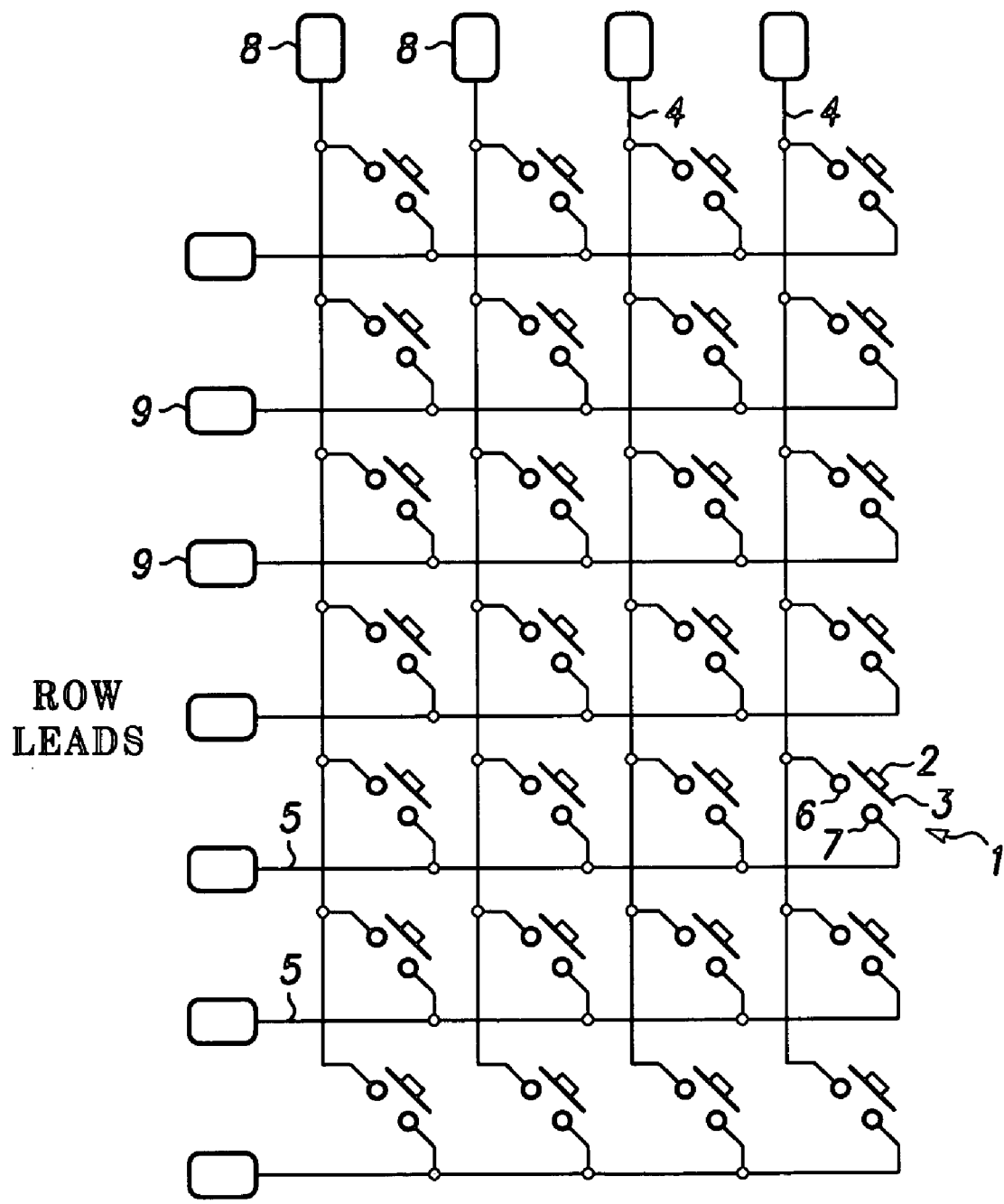
FIG. 1 is a diagram of a known keypad.

The keypad shown in FIG. 1 comprises an array of keys or push-button switches 1 each comprising a button 2 projecting through a two-dimensional surface (not shown) and bearing an electrical connection element 3. The keypad also comprises column leads 4 and row leads 5, the switches 1 comprising contact elements 6 connected to individual column leads and contact elements 7 connected to individual row leads. The key 1 is biased mechanically away from the contact element 6 and 7 but connects the contact elements 6 and 7 electrically when actuated by a user pushing the button 2. Connection in this way of the contact elements 6 and 7 of any given push-button switch 1 makes a respective unique connection between a column lead 4 and a row lead 5.

Each column lead 4 has a corresponding column terminal 8, and each row lead 5 has a corresponding row terminal 9. In this example of a keypad, the array of switches 1 comprises 4 columns and 7 rows, so that there are a total of 11 terminals to be connected to respective pins on a signal processor circuit (not shown). It is desirable to reduce the number of pins to which the keypad must be connected.

Figure 2:
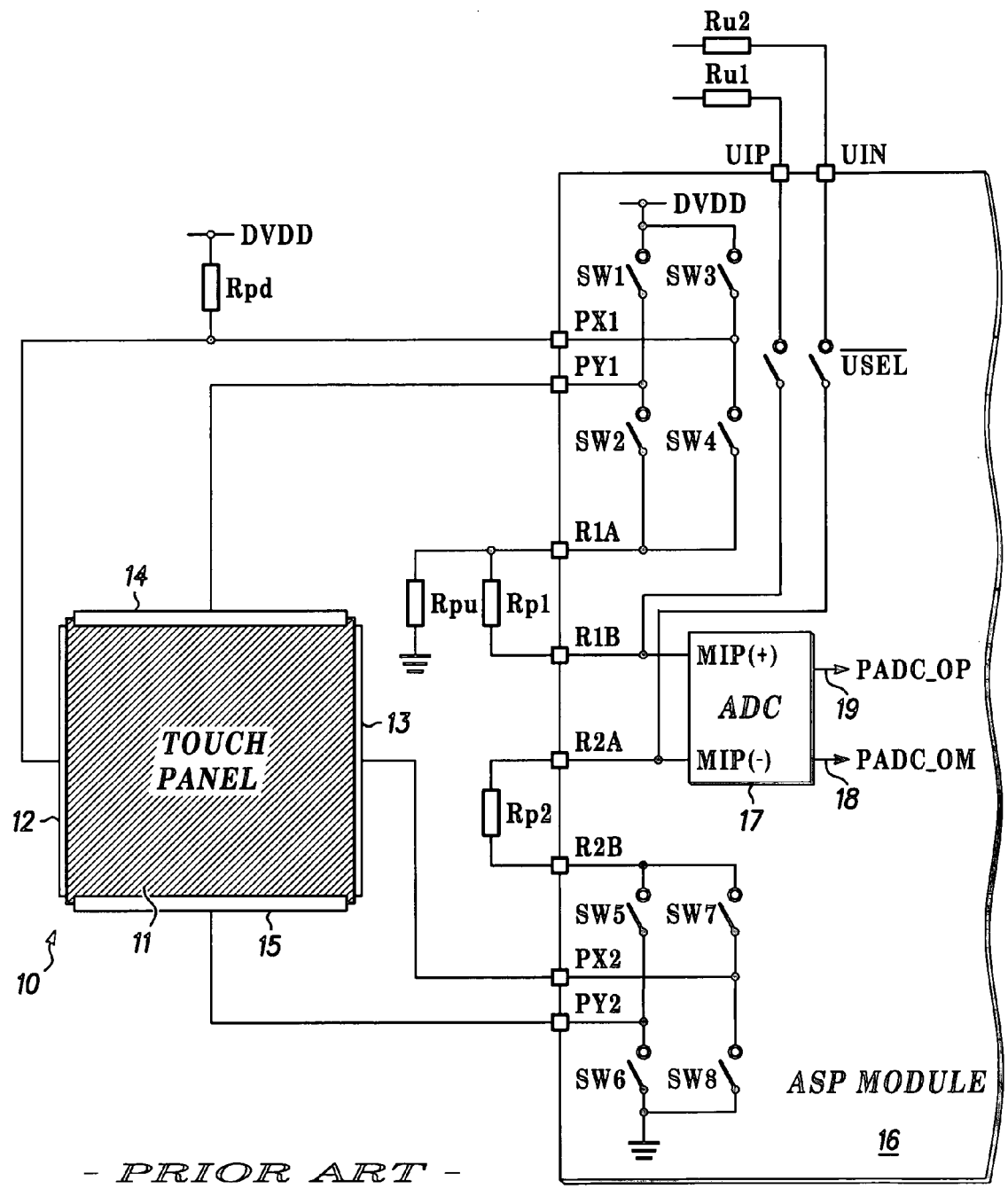
FIG. 2 is a diagram of a known resistive touch screen and signal processor.

FIG. 2 shows another data entry apparatus, comprising a touch panel 10. Touch panels are well-known in the art and the touch panel illustrated is of the kind comprising an upper resistive layer 11 and a lower resistive layer (not shown), which are spaced apart by an electrically insulating system which allows the upper and lower layers to make localised contact with each other when a pointed object such as a stylus is pressed at a point on the upper surface 11 by the user. Electrical connection is made to opposite edges of the upper resistive layer 11 by spaced X-electrodes 12 and 13 and to opposite edges of the lower layer, orthogonal to the electrodes 12 and 13, by Y-electrodes 14 and 15.

The touch panel 10 is connected to an analogue signal processor module 16. The electrode 12 is connected to a pin PX1 of the processor 16 and through a resistor Rpd to a reference voltage force DVDD. The electrode 13 is connected to a pin PX2 of the processor 16. The electrodes 14 and 15 are connected to pins PY1 and PY2 respectively of the processor 16. A pin R1A of the processor 16 is connected through a resistor Rpu to ground and through a resistor Rp1 to a pin R1B of the processor. A pin R2A of the processor is connected through a resistor Rp2 to a pin R2B of the processor.

The energisation and detection of the touch screen 10 is controlled by internal switches SW1 to SW8 of the processor. In more detail, one terminal of the switch SW1 is connected to the reference voltage terminal DVDD and its other terminal is connected to the pin PY1. One terminal of the switch SW2 is connected to the pin PY1 and the other terminal is connected to the pin R1A. One terminal of the switch SW3 is connected to the reference voltage terminal DVDD and its other terminal is connected to the pin PX1. One terminal of the switch SW4 is connected to the pin PX1 and the other terminal is connected to the pin R1A. One terminal of the switch SW5 is connected to the pin R2B and its other terminal is connected to the pin PY2. One terminal of the switch SW6 is connected to the pin PY2 and its other terminal is connected to ground. One terminal of the switch SW7 is connected to the pin R2B and its other terminal is connected to the pin PX2. One terminal of the switch SW8 is the connected to the pin PX2 and its other terminal is connected to ground. The pins R1B and R2A are connected to the positive and negative inputs of the analogue to digital converter 17 that converts the analogue signals at its inputs to digital signals at its outputs 18 and 19.

In operation, the voltage level of PX1 is monitored to detect a panel touch. While in the idle mode, the pin PY2 is connected to GND, while PX1 is pulled-up to DVDD by the resistor Rpd. When the panel is touched, the PX1 input is pulled towards ground through the touch screen and PY2. This produces a falling edge and triggers a panel touch detection interrupt.

The subsequent sequence of operation of the switches is automatically generated once an interrupt signal is generated in response to the user touching the upper layer, the analogue signals measured at the electrodes being applied to an analogue to digital converter 17 in the processor 16, which generates digital output signals at output terminals 18 and 19. The processor 16 applies a voltage alternately across the pair of electrodes 12 and 13 and across the pair of electrodes 14 and 15, and responds to the voltage at the other electrode pair. In operation, localised contact at a point on the touch screen produced by the user touching the upper layer 11 causes the upper layer and lower layer of the touch panel 10 to present voltage dividers when a voltage is applied across either pair of the electrodes 12, 13 or 14, 15, the resistance ratio of the voltage divider defining the position at which the upper layer 11 is touched.

Figure 3:
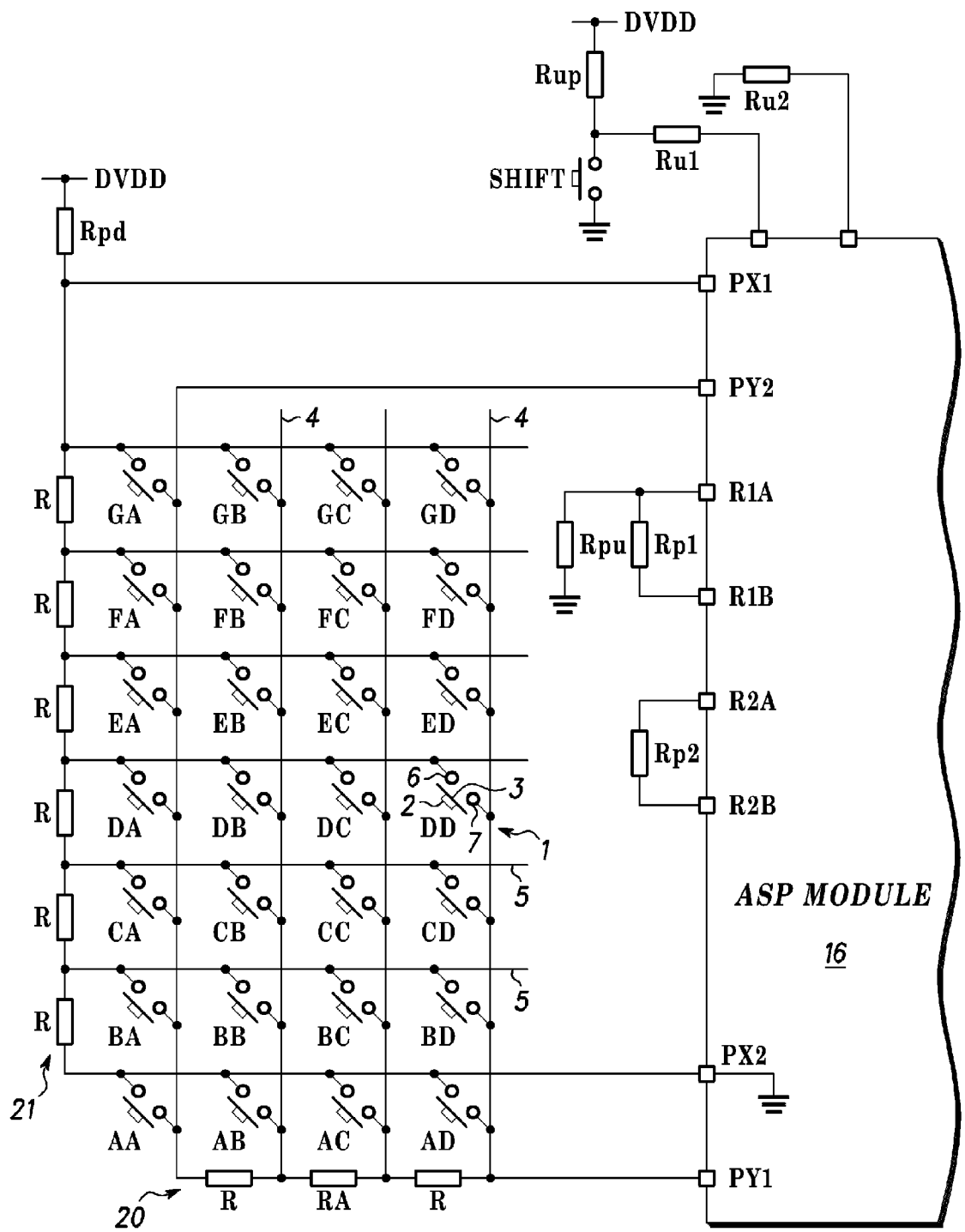
FIG. 3 is a diagram of keypad apparatus in accordance with one embodiment of the invention, given by way of example.

FIG. 3 shows keypad apparatus in accordance with one embodiment of the present invention. Elements which are similar to the keypad of FIG. 1 bear similar reference numerals. However, the keypad apparatus 1 of FIG. 3 only requires connection to four input-output pins of a signal processor. The keypad apparatus 1 of FIG. 3 comprises a first set of identical impedance elements 20 and a second set of identical impedance elements 21 that are connected to the signal processor. The impedance elements of the sets 20 and 21 are connected together and to the ends of the sets through respective interconnections. In the preferred embodiment of the invention, the impedance elements of the sets 20 and 21 are resistive elements R. In another embodiment of the invention, the impedance elements are capacitive elements, the keypad apparatus being fed by a sinusoidal voltage supply instead of the direct reference voltage at terminal DVDD.

Figure 4:
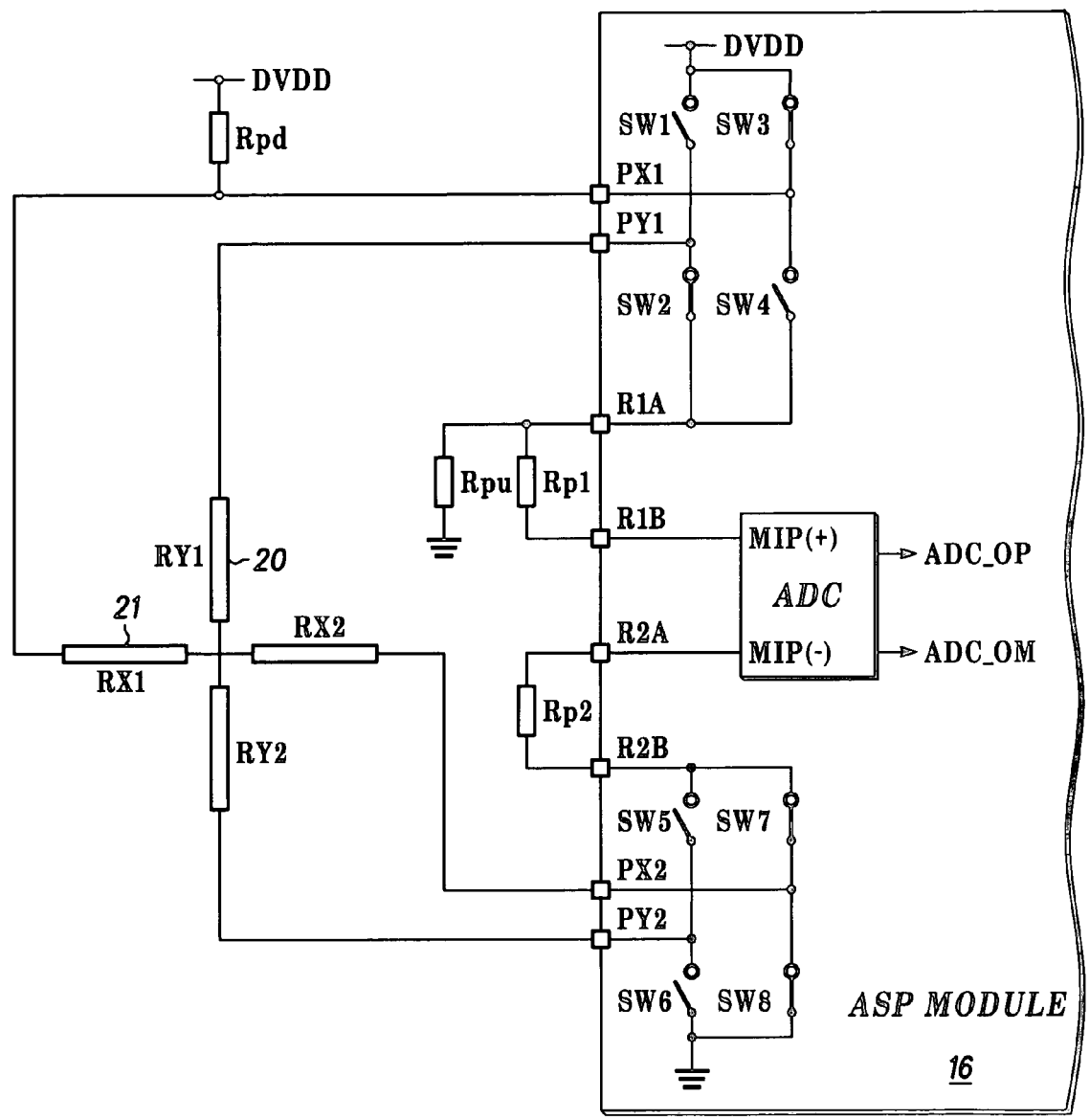
FIG. 4 is a diagram of the keypad apparatus of FIG. 3 and signal processor in operation sensing X-coordinates of an actuated key.

In the embodiment of the invention shown in FIG. 3, the signal processor for the keypad is a processor 16 like that shown in FIG. 2. As shown in FIG. 4, the column leads 4 are connected to respective interconnections of the set 20 (including interconnections at the ends of the set) and the row leads 5 are connected to respective interconnections of the impedance element set 21. One end interconnection of the set 20 is connected to the pin PY1 and the other end interconnection is connected to the pin PY2. One end interconnection of the set 21 is connected to the pin PX1 and the other end to the pin PX2.

It will be appreciated that the connection of the array of keys 1 to the sets 20 and 21 of impedance elements enables the keypad apparatus to emulate a touch panel. In particular, pressing one of the keys 1 makes connections between a respective unique combination of the interconnections in the sets of impedance elements 20 and 21 through its contact elements 6 and 7. When one of the pairs of pins PX1, PX2 or PY1, PY2 is energised while one of the keys 1 is pressed, output signals are generated that are a corresponding unique combination of the reference voltage DVDD applied across the sets of impedance elements 20 and 21, which act as respective voltage dividers whose division ratios depend on which column and row lead 4 and 5 is activated by the selected key 1.

A measurement of the X-position of the actuated key switch 1 is made by closing switch SW2 to connect the PY1 input to the ADC 17, by closing switch SW3 to apply DVDD to PX1 and closing switches SW7 and SW8 to connect PX2 and R2B to ground, as shown in FIG. 4. The other switches SW1 and SW4 to SW6 are open, so that the pin PY2 and corresponding interconnection of the set 20 of impedance elements is floating. The voltage appearing at the pin PY1 is then applied through pin R1A, resistor Rp1 and pin RIB to the positive input of the A/D converter 17, whose negative input is connected to ground through pin R2A, resistor Rp2 and pin R2B.

The voltage measured is determined by the voltage divider developed in the set 20 of impedance elements by the actuated switch 1 between divided values illustrated as RX1 and RX2. For this measurement, the Y-divider resistance RY1 does not affect the conversion due to high input impedance of the A/D converter.

Figure 5:
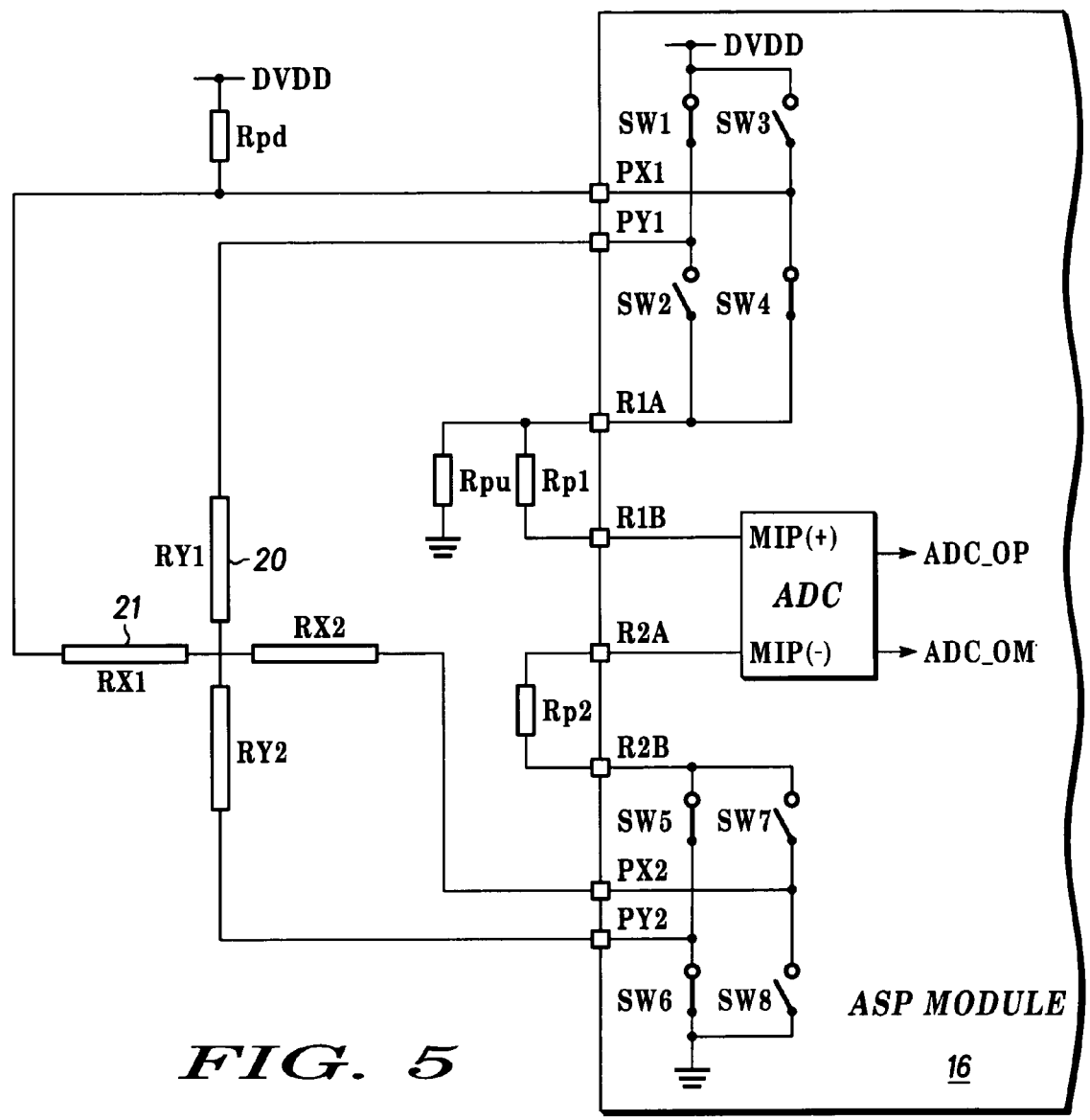
FIG. 5 is a diagram of the keypad apparatus of FIG. 3 and signal processor in operation sensing Y-coordinates of an actuated key.

Voltage is then applied to the other axis to measure the Y-position of the actuated key switch 1 by closing switch SW4 to connect the PX1 input to the ADC 17, by closing switch SW1 to apply DVDD to PY1 and closing switches SW5 and SW6 to connect PY2 and R2A and R2B to ground, as shown in FIG. 5. The other switches SW2, SW3, SW7 and SW8 are open, so that the pin PX2 and corresponding interconnection of the set 21 of impedance elements is floating. The voltage appearing at the pin PX1 is then applied through pin R1A, resistor Rp1 and pin RIB to the positive input of the A/D converter 17, whose negative input is connected to ground through pin R2A, resistor Rp2 and pin R2B.

The measurements of the X- and Y-axes continue to be made alternately.

With equal values for each of the impedance elements of the sets 20 and 21, examples of the relative voltages measured for actuation of any one of the keys illustrated in FIG. 3 is shown below.

| Keys | X | Y |
|------|---|---|
| AA | 0 | 0 |
| AB | 0 | 0.6 |

-continued

| Keys | X | Y |
|---|---|---|
| AC | 0 | 1.2 |
| AD | 0 | 1.8 |
| BA | 0.3 | 0 |
| BB | 0.3 | 0.6 |
| BC | 0.3 | 1.2 |
| BD | 0.3 | 1.8 |
| CA | 0.6 | 0 |
| CB | 0.6 | 0.6 |
| CC | 0.6 | 1.2 |
| CD | 0.6 | 1.8 |
| DA | 0.9 | 0 |
| DB | 0.9 | 0.6 |
| DC | 0.9 | 1.2 |
| DD | 0.9 | 1.8 |
| EA | 1.2 | 0 |
| EB | 1.2 | 0.6 |
| EC | 1.2 | 1.2 |
| ED | 1.2 | 1.8 |
| FA | 1.5 | 0 |
| FB | 1.5 | 0.6 |
| FC | 1.5 | 1.2 |
| FD | 1.5 | 1.8 |
| GA | 1.8 | 0 |
| GB | 1.8 | 0.6 |
| GC | 1.8 | 1.2 |
| GD | 1.8 | 1.8 |

It will be noted that there is a difference of 0.3 volts between the differing coordinates of any two adjacent keys. This enables the keys to be readily distinguished and identified by the analogue to digital converter 17.

Figure 6:
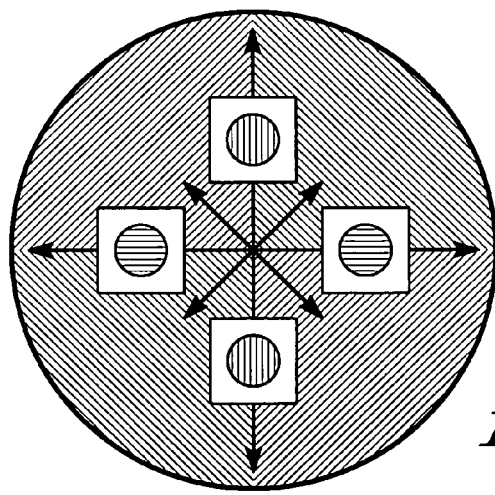
FIG. 6 is a plan view of a jog-pad module for use with the keypad apparatus of FIG. 3.

Further functions can be obtained with the addition of a "jog pad" module, illustrated in plan view in FIG. 6, which is particularly useful when playing certain games associated with the control of moving images, for example. The jog pad enables a disk shaped pad to be rocked forwards and backwards or left and right to actuate any one of four adjacent keys, but also to be rocked diagonally to actuate two adjacent keys 1 simultaneously. It is also possible to actuate two adjacent keys directly in the absence of such a jog pad.

Figure 7:
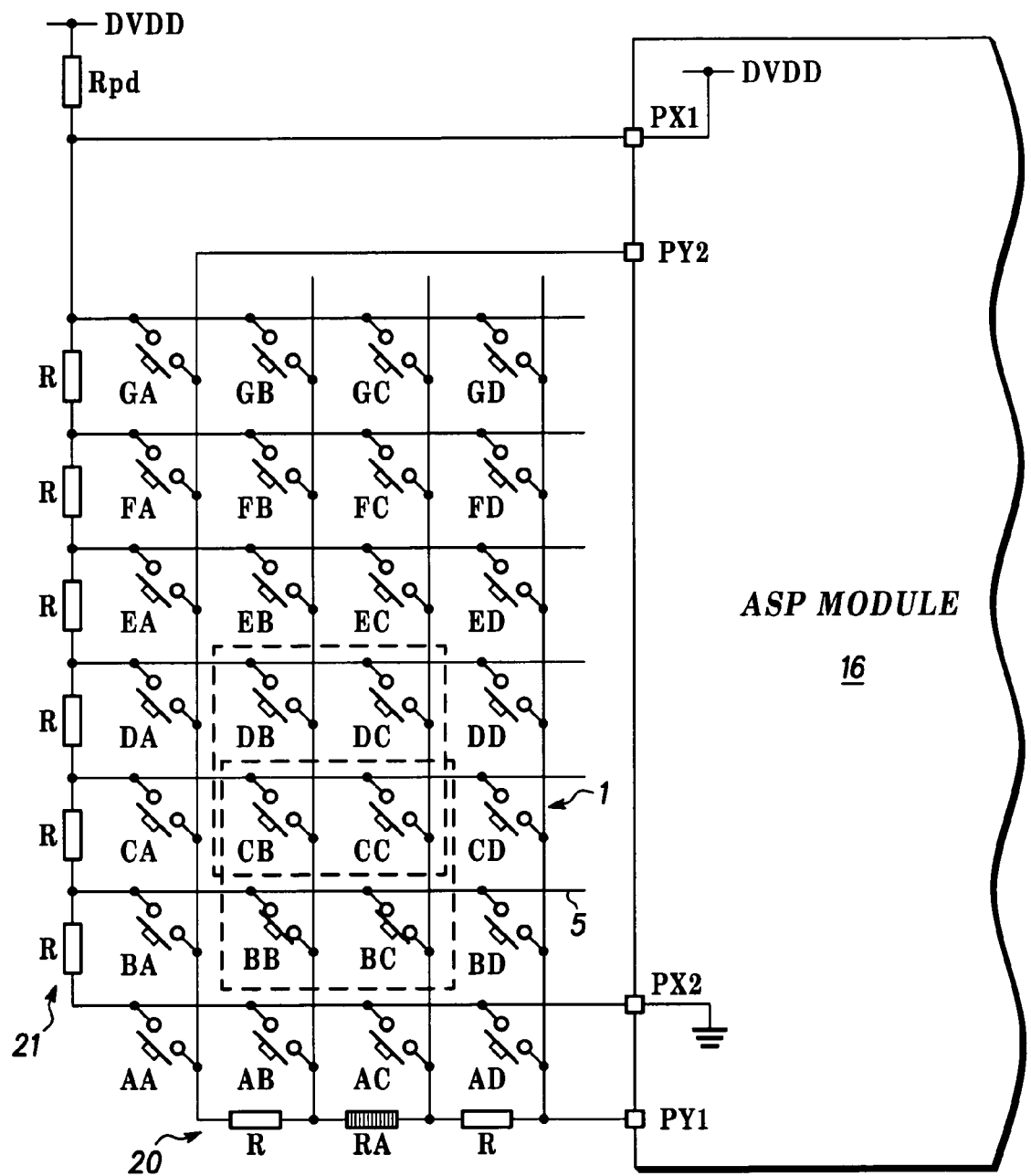
FIG. 7 is a diagram of the keypad apparatus of FIG. 3 with two keys actuated.

The operation of the key pad apparatus of FIG. 3 corresponding to simultaneous actuation of two keys BB and BC in the same row is illustrated in FIG. 7 and corresponds to short-circuiting of the impedance element RA of the set 20 that both of the actuated keys are connected to. Typical voltages resulting from the simultaneous actuation of two keys in the same row or column are illustrated in the table below.

| Keys | X | Y |
|---|---|---|
| BB & BC | 0.3 | 0.9 |
| BB & CB | 0.36 | 0.6 |
| CB & CC | 0.6 | 0.9 |
| CC & BC | 0.36 | 1.2 |
| CB & CC | 0.6 | 0.9 |
| CB & DB | 0.72 | 0.6 |
| DB & DC | 0.9 | 0.9 |
| DC & CC | 0.72 | 1.2 |

It will be seen that intermediate coordinate values are obtained from the simultaneous actuation of two keys in the same row or column which are readily distinguishable from any other coordinate values obtained by pressing one or two keys, the values of the other coordinate (column or row) differing only within the normal margin of error, due to the high input impedance of the ADC17.

Figure 8:
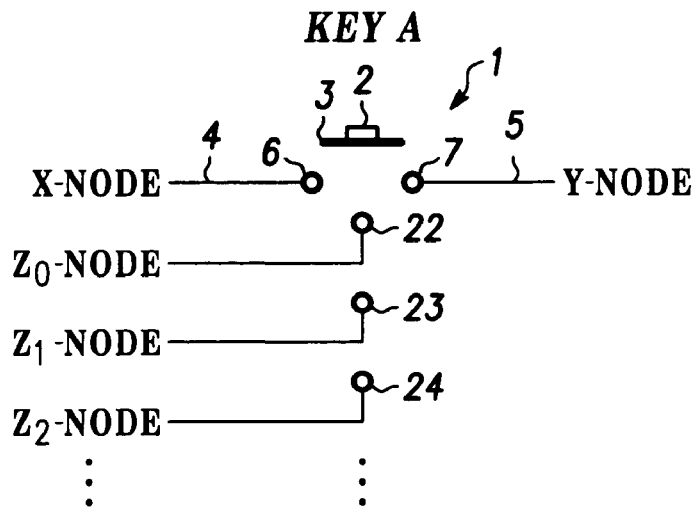
FIG. 8 is a schematic diagram of a three-dimensional switch element in a preferred embodiment of the invention, given by way of example.

In a preferred embodiment of the invention illustrated in FIG. 8, at least some of the keys 1 comprise further Z-node contact elements such as 22, 23 and 24 with which the conducting element 3 of the key may make contact while maintaining contact with the contact element 6 and 7 of the X-node and Y-node. The Z-node contact elements 22 to 24 are spaced apart perpendicularly beneath the keypad surface so that as the key 1 is progressively depressed further, it selectively contacts the contact elements 22 to 24 in succession.

Figure 9:
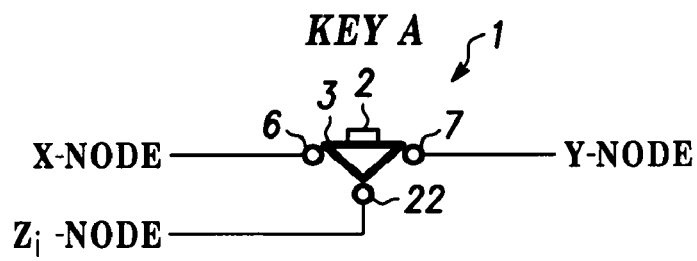
FIG. 9 is a schematic diagram of one form of actuation of the three-dimensional switch element of FIG. 8.
Figure 10:
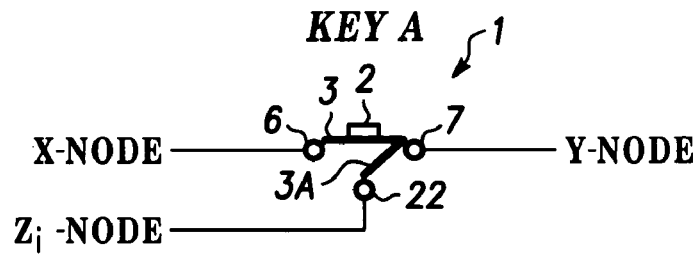
FIG. 10 is a schematic diagram of another form of actuation of the three-dimensional switch element of FIG. 8.

As shown in FIG. 9, in one embodiment of the invention, the electrical connecting element 3 makes a connection between the contact elements 6 and 7 of the X-node and Y-node and simultaneously makes a connection with the selected contact element 22 to 24 of the Z-node. In an alternative embodiment shown in FIG. 10, the electrical connecting element 3 makes a connection between the contact elements 6 and 7 of the X-node and Y-node and a further connection member 3A makes a connection between the selected contact element 22 to 24 of the Z-node and one of the contact elements 6 and 7, in the example illustrated the contact element 6 of the Y-node, electrical connection with the other electrical contact element, in this case the contact element 7 of the X-node being made through the connecting element 3.

Figure 11:
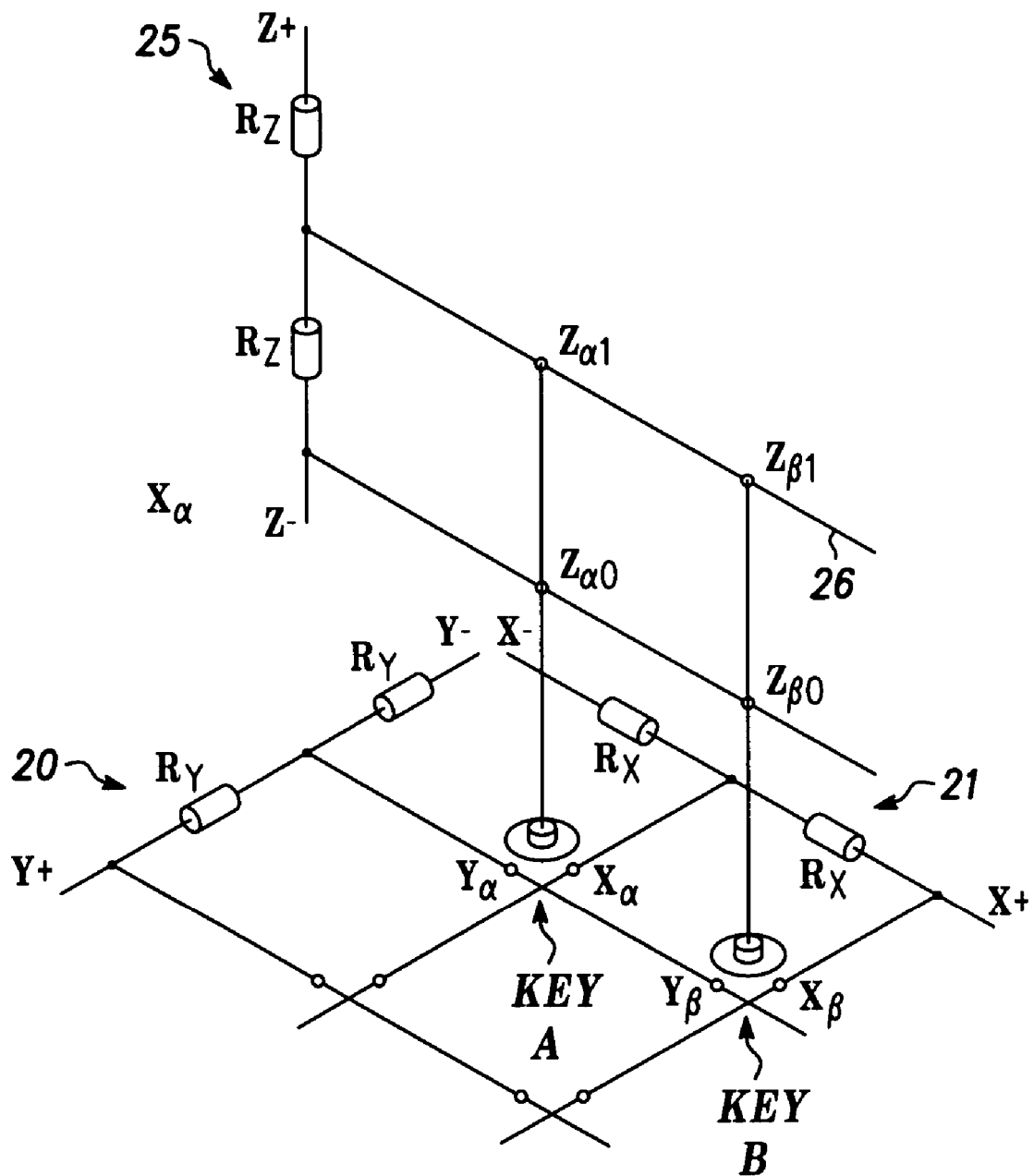
FIG. 11 is a schematic diagram of resistor networks used in keypads incorporating the three-dimensional switch elements of FIG. 8.

As shown in FIG. 11, a set of impedance elements 25 is provided for the Z-contact elements such as 22 to 24, comprising interconnected impedance elements similar to those of the sets 20 and 21. The contact elements such as 22 are connected through Z-leads 26 to respective interconnections of the set 25 and the contact elements such as 23 and 24 are connected by respective Z-leads to other interconnections of the set 25.

Accordingly, in this embodiment of the invention, each key α has a unique X and Y position with corresponding unique combination of electrical connections to the impedance element sets 20 and 21, and a plurality of Z-nodes for different positions transversely to the surface of the keypad. Thus the switch position is identified by its electrical X, Y and Z co-ordinates. In operation, the cycle of measurement of the co-ordinates alternates between the sets 20, 21 and 25. When a key α is depressed, $X_\alpha$, $Y_\alpha$ and $Z_\alpha$ are connected together. Voltage is first applied across the set 21 of impedance elements to measure the X co-ordinates and the voltage is sensed on the pin PY1. Next the voltage is applied across the set 20 of impedance elements and the voltage at the pin PX1 is measured, corresponding to the Y co-ordinates. Lastly, the voltage is applied across the set 25 of impedance elements and the voltage is again measured on pin PY1 to measure the Z co-ordinates of the key.

It will be appreciated that such three dimensional keys are particularly valuable in a joystick module, utilising 4 or 8 adjacent keys that are three dimensional as described above, since the different Z positions of the keys multiply the number of different possible combinations of positions of the joystick that can be sensed.

The keypad apparatus and signal processor described above may be used instead of a touch panel or touch screen in a device such as a portable telephone or personal digital assistant. In one embodiment of the invention, the keypad such as shown in FIG. 3 may be disconnected from the signal processor 16 and a resistive touch screen or other touch panel connected in its place, offering an alternative data entry for alternative uses of the device. In a preferred embodiment of the invention, the device includes both the keypad and a resistive touch screen, with a multiplex device (not shown) to connect the signal processor 16 alternatively to the resistive touch screen or the keypad. In this way, a single signal processor may be used for both the data entry modules.

With the embodiments of the invention shown in the accompanying drawings, no extra input-output pins are required on the signal processor 16. The provision of the sets of impedance elements 20, 21 and 25 may be provided in a small and inexpensive package, especially where resistive elements are used as described. Only 4 line connectors are needed between the keypad of FIG. 3 and the signal processor 16, in the case of the two dimensional keypad.

The operation of the signal processor 16 has been described with the use of direct reference voltages applied in alternation in time to the respective sets of impedance elements to measure the position of the actuated key in different co-ordinates. In another embodiment of the invention, alternating reference voltages of different frequencies are applied simultaneously to the different sets of impedance elements and the co-ordinate positions are measured simultaneously, the signal processor 16 distinguishing the measured co-ordinates by the frequency.

The invention claimed is:

1. Keypad apparatus for registering signals corresponding to data that a user enters by pressure, comprising:
   a surface extending in two dimensions;
   first and second sets of impedance elements, the elements of each set being connected in series through respective interconnections;
   reference signal means for applying first and second reference signals across said first and second sets of impedance elements respectively; and
   an array of discrete key elements juxtaposed with said surface and selectively actuable by user pressure on said key elements to make or break connections through corresponding contact elements between a respective pair of said interconnections, one from said first set of impedance elements and one from said second set of impedance elements, characterised by said reference signal means is arranged to apply said reference signals alternately across said first set and across said second set of impedance elements, so as to generate first and second output signals that together are a corresponding combination of said first and second reference signals that is unique to the actuated key element or key elements, and output means responsive to said output signals, said output means comprising analogue-to-digital converter means common to said first and second output signals, wherein said analogue-to-digital converter means is responsive to analogue values of said output signals to generate digital output signals.

2. Keypad apparatus as claimed in claim 1, wherein said reference signals are respective direct voltages and said impedance elements present electrical resistances.

3. Keypad apparatus as claimed in claim 1, wherein said array of discrete key elements compnses a two-dimensional array of switches disposed at said surface for actuation by the user and connected with respective pairs of said interconnections.

4. Keypad apparatus as claimed in claim 3, wherein said array of discrete key elements is an orthogonal array.

5. Keypad apparatus as claimed in claim 3, and comprising;
   a third set of impedance elements connected in series through respective interconnections, said reference signal means being arranged to apply third reference signals across said third set of impedance elements, at least some of said key elements comprising a three-dimensional disposition of said electrical contact elements, said key elements being progressively movable transversely to said surface by user pressure to make or break connections through corresponding contact elements between an interconnection from said first set of impedance elements, an interconnection from said second set of impedance elements and also a interconnection from said third set of impedance elements selected by an amount of user pressure, so as to generate said first and second output signals and third output signal that together are a corresponding combination of said first, second and third reference signals that is unique to the actuated contact element or elements.

6. Keypad apparatus as claimed in claim 5, wherein simultaneous actuation of adjacent ones of said discrete key elements is arranged to generate said first and second output signals as a corresponding combination of said first and second reference signals unique to the simultaneously actuated key elements.

7. Keypad apparatus as claimed in claim 1, wherein said reference signal means is arranged to apply said reference signals alternately across said first set and across said second set of impedance elements, so as to generate said first and second output signals alternately.

8. Keypad apparatus as claimed in claim 7, wherein said reference signal means is responsive to actuation of at least one of said discrete key elements to trigger application of said reference signals alternately across said first and second sets of impedance elements.

9. Keypad apparatus as claimed in claim 8, wherein said reference signal means is responsive to actuation of at least one of said discrete key elements to generate a trigger signal, said reference signal means including signal processing means responsive to said trigger signal for processing said output signals.

10. Keypad apparatus as claimed in claim 8, wherein said first and second sets of impedance elements are connected between first and second pairs of terminals respectively, of said reference signal means, said reference signal means is arranged to apply said reference signals alternately across said first and second pairs of terminals, and said output means is responsive to said output signals appearing at at least one of said terminals to which said reference signals are not being applied.

11. Data entry apparatus comprising keypad apparatus as claimed in claim 5 and further comprising a touch panel apparatus comprising first and second juxtaposed impedance layers presenting distributed impedances, first and second pairs of electrodes coupled with respective pairs of opposed edges of said impedance layers, and connection means for selectively operably connecting said reference signal means and said output means with said of impedance elements of said keypad apparatus or with said pairs of electrodes of said touch panel apparatus.

* * * * *